US012676283B2

(12) United States Patent (10) Patent No.: US 12,676,283 B2
Hofmann et al. (45) Date of Patent: Jul. 7, 2026

(54) METHOD FOR PARTICLE BEAM-INDUCED PROCESSING OF A DEFECT OF A MICROLITHOGRAPHIC PHOTOMASK

(71) Applicant: Carl Zeiss SMT GmbH, Oberkochen (DE)

(72) Inventors: Thorsten Hofmann, Rodgau (DE); Michael Budach, Hanau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 735 days.

(21) Appl. No.: 17/940,688

(22) Filed: Sep. 8, 2022

(65) Prior Publication Data

US 2023/0081844 A1 Mar. 16, 2023

(30) Foreign Application Priority Data

Sep. 10, 2021 (DE) ..................... 10 2021 123 440.9

(51) Int. Cl.
$H01J$ *37/22* (2006.01)
*G03F 1/74* (2012.01)
(Continued)

(52) U.S. Cl.
CPC .............. *H01J 37/222* (2013.01); *G03F 1/74* (2013.01); *G03F 7/70608* (2013.01);
(Continued)

(58) Field of Classification Search
CPC ........ H01J 37/00; H01J 37/02; H01J 37/1471; H01J 37/222; H01J 37/26; H01J 37/28;
(Continued)

(56) References Cited

U.S. PATENT DOCUMENTS

| 4,952,421 A | 8/1990 | Morimoto et al. |
| 5,103,101 A | 4/1992 | Berglund et al. |

(Continued)

FOREIGN PATENT DOCUMENTS

| DE | 10 2008 011 531 A1 | 9/2009 |
| DE | 10 2017 208 114 A1 | 3/2018 |

(Continued)

OTHER PUBLICATIONS

Office Action and Search Report issued by the Taiwan Patent Office for Application No. 111132545, dated Jul. 10, 2023 (with English Translation).

(Continued)

*Primary Examiner* — Jason L McCormack
(74) *Attorney, Agent, or Firm* — Fish & Richardson P.C.

(57) ABSTRACT

A method for particle beam-induced processing of a defect of a microlithographic photomask, including the steps of:
 a1) providing an image of at least a portion of the photomask,
 b1) determining a geometric shape of a defect in the image as a repair shape,
 c1) subdividing the repair shape into a number of n pixels in accordance with a first rasterization,
 d1) subdividing the repair shape into a number of m pixels in accordance with a second rasterization, the second rasterization emerging from a subpixel displacement of the first rasterization,
 e1) providing an activating particle beam and a process gas at each of the n pixels of the repair shape in accordance with the first rasterization, and
 f1) providing the activating particle beam and the process gas at each of the m pixels of the repair shape in accordance with the second rasterization.

20 Claims, 9 Drawing Sheets

(51) Int. Cl.

| | |
|---|---|
| *G03F 7/00* | (2006.01) |
| *H01J 37/147* | (2006.01) |
| *H01J 37/28* | (2006.01) |
| *H01J 37/305* | (2006.01) |

(52) U.S. Cl.
CPC ...... *G03F 7/70975* (2013.01); *H01J 37/1471* (2013.01); *H01J 37/28* (2013.01); *H01J 37/3053* (2013.01); *H01J 2237/2817* (2013.01); *H01J 2237/30488* (2013.01); *H01J 2237/31744* (2013.01)

(58) Field of Classification Search
CPC .......... H01J 37/3053; H01J 2237/2817; H01J 2237/30488; H01J 2237/31744; G03F 7/70608; G03F 7/70975; G03F 1/74
USPC ........................................ 250/306, 307, 311
See application file for complete search history.

(56) References Cited

U.S. PATENT DOCUMENTS

| | | | |
|---|---|---|---|
| 5,882,823 | A | 3/1999 | Neary |
| 6,322,672 | B1 | 11/2001 | Shuman et al. |
| 7,088,468 | B1 | 8/2006 | Thurén |
| 9,721,754 | B2 | 8/2017 | Bret et al. |
| 2001/0027917 | A1 | 10/2001 | Ferranti et al. |
| 2002/0177055 | A1 | 11/2002 | Hagiwara et al. |
| 2003/0077524 | A1 | 4/2003 | Choi |
| 2003/0215722 | A1 | 11/2003 | Kanamitsu et al. |
| 2005/0084766 | A1 | 4/2005 | Sandstrom |
| 2008/0160431 | A1 | 7/2008 | Scott et al. |
| 2008/0302979 | A1 | 12/2008 | Kozakai |
| 2010/0297362 | A1 | 11/2010 | Budach et al. |
| 2012/0028464 | A1 | 2/2012 | Scott et al. |
| 2014/0255831 | A1 | 9/2014 | Hofmann et al. |
| 2015/0330912 | A1* | 11/2015 | Gosain .................. H01J 37/222 |
| | | | 250/306 |
| 2017/0007315 | A1 | 1/2017 | Bender |
| 2017/0248842 | A1* | 8/2017 | Oster .................... C23C 16/405 |
| 2017/0292923 | A1 | 10/2017 | Baralia et al. |
| 2017/0352144 | A1 | 12/2017 | Yu et al. |
| 2020/0096862 | A1 | 3/2020 | Tolani et al. |
| 2020/0131618 | A1 | 4/2020 | Moon et al. |
| 2020/0249564 | A1 | 8/2020 | Budach et al. |
| 2021/0073969 | A1 | 3/2021 | Freytag et al. |

FOREIGN PATENT DOCUMENTS

| | | | |
|---|---|---|---|
| DE | 10 2019 201 468 A1 | 8/2020 | |
| DE | 102021115736 | 12/2022 | |
| JP | H01-197757 | 8/1989 | .............. G03F 1/00 |
| JP | H02-77745 | 3/1990 | .............. G03F 1/08 |
| JP | H05-204135 | 8/1993 | .............. G03F 1/08 |
| JP | H06-289310 | 10/1994 | .............. G02B 26/10 |
| JP | H09-22110 | 1/1997 | .............. G03F 1/08 |
| JP | 2002-184342 | 6/2002 | .............. H01J 37/30 |
| JP | 2003-133206 | 5/2003 | ........... H01L 21/027 |
| JP | 2003-140316 | 5/2003 | .............. G03F 1/08 |
| JP | 2003-526919 | 9/2003 | ........... H01L 21/302 |
| JP | 2006-301406 | 11/2006 | .............. G03F 1/08 |
| JP | 2007-503009 | 2/2007 | .............. G03F 1/08 |
| JP | 2011-513775 | 4/2011 | .............. G03F 1/08 |
| JP | 2014-174552 | 9/2014 | .............. G03F 1/74 |
| KR | 1020040065243 | 7/2004 | .............. G03F 7/20 |
| KR | 1020170101149 | 9/2017 | ........... H01L 21/027 |
| TW | 201802465 | 1/2018 | .......... G01N 23/225 |
| TW | 202012919 | 4/2020 | ........... G01N 21/94 |
| WO | WO-8809049 A1 * | 11/1988 | ........... H01J 37/317 |
| WO | WO 2005/017949 | 2/2005 | |

OTHER PUBLICATIONS

Office Action and Search Report issued by the Taiwan Patent Office for Application No. TW 113111964 dated Feb. 11, 2025 (with English Translation).

Office Action issued by the Korean Patent Office for Application No. KR 10-2022-0113263, dated Dec. 26, 2024 (with English Translation).

Office Action issued by the Japanese Patent Office for Application No. JP 2022-142897, dated Oct. 30, 2023 (with English Translation).

Office Action issued by the German Patent Office for Application No. DE 10 2021 123 440.9, dated Mar. 6, 2024 (with English Translation).

Office Action issued by the Japanese Patent Office for Application No. JP 2024-100254, dated Apr. 10, 2025 (with English Translation).

Extended European Search Report for Application No. EP 22 19 1527, dated May 9, 2023.

Notice of Allowance issued by the Korean Patent Office for Application No. KR 10-2022-0113263, dated Aug. 12, 2025 (with English Translation).

Office Action and Search Report in Chinese Appln. No. 202211094796. 2, mailed on Dec. 24, 2025, 12 pages (with English translation).

Office Action in Japanese Appln. No. 2024-100254, mailed on Oct. 16, 2025, 9 pages (with English translation).

* cited by examiner

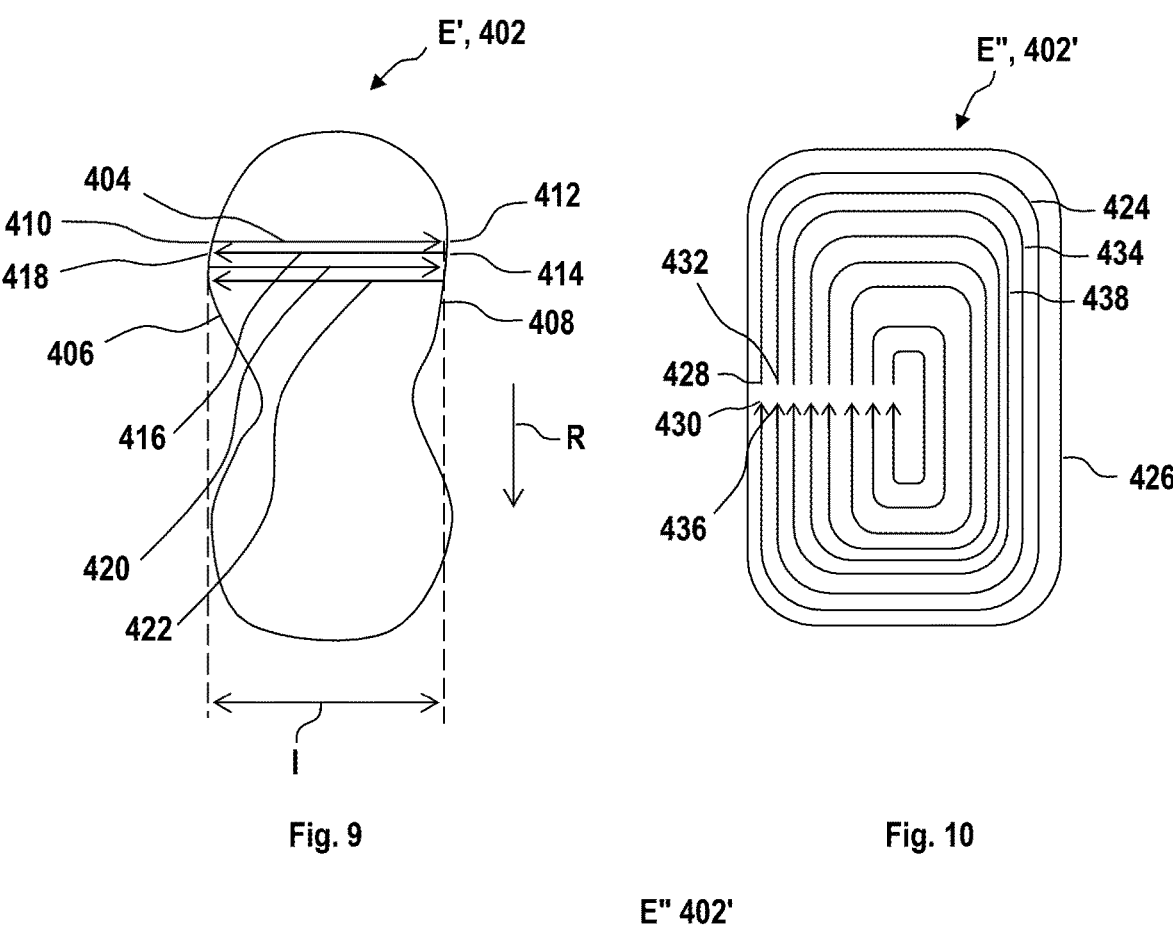
Fig. 9                                                    Fig. 10
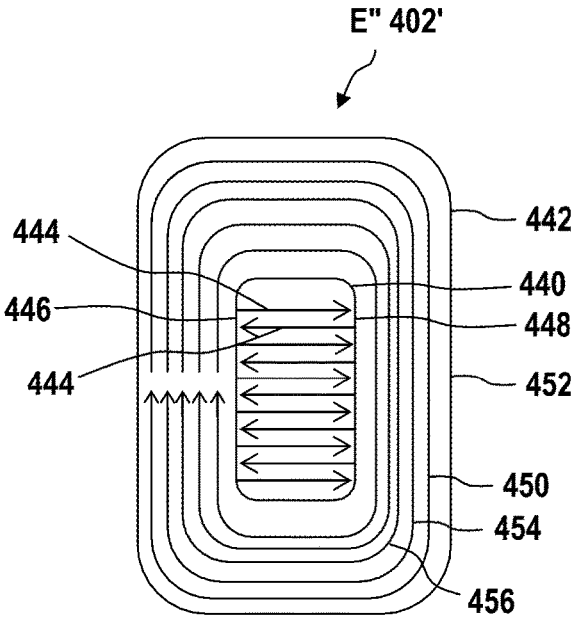
Fig. 11

METHOD FOR PARTICLE BEAM-INDUCED PROCESSING OF A DEFECT OF A MICROLITHOGRAPHIC PHOTOMASK

CROSS-REFERENCE TO RELATED APPLICATION

This application claims priority to German Patent Application DE 10 2021 123 440.9, filed on Sep. 10, 2021, the content of which is herein incorporated by reference in its entirety.

TECHNICAL FIELD

The present invention relates to a method for particle beam-induced processing of a defect of a microlithographic photomask.

BACKGROUND

Microlithography is used for producing microstructured component elements, such as for example integrated circuits. The microlithography process is performed using a lithography apparatus, which has an illumination system and a projection system. The image of a mask (reticle) illuminated by use of the illumination system is in this case projected by use of the projection system onto a substrate, for example a silicon wafer, which is coated with a light-sensitive layer (photoresist) and arranged in the image plane of the projection system, in order to transfer the mask structure to the light-sensitive coating of the substrate.

In order to attain small structure dimensions and hence to increase the integration density of the microstructured components, use is increasingly being made of light having very short wavelengths, referred for example as deep ultraviolet (DUV) or extreme ultraviolet (EUV). DUV has a wavelength of 193 nm, for example, and EUV has a wavelength of 13.5 nm, for example.

SUMMARY

In this case, the microlithographic photomasks have structure dimensions ranging from a few nanometers to several 100 nm. The production of such photomasks is very complicated and therefore costly. In particular, this is the case because the photomasks have to be defect-free as it is otherwise not possible to ensure that a structure produced on the silicon wafer by use of the photomask exhibits the desired function. In particular, the quality of the structures on the photomask is decisive for the quality of the integrated circuits produced on the wafer by use of the photomask.

It is for this reason that microlithographic photomasks are checked for the presence of defects and found defects are repaired in a targeted manner. Typical defects include the lack of envisaged structures, for example because an etching process was not carried out successfully, or else the presence of non-envisaged structures, for example because an etching process proceeded too quickly or developed its effect at a wrong site. These defects can be remedied by targeted etching of excess material or targeted deposition of additional material at the appropriate positions; by way of example, this is possible in a very targeted manner by use of electron beam-induced processes (FEBIP, "focused electron beam induced processing").

DE 10 2017 208 114 A1 describes a method for particle beam-induced etching of a photolithographic mask. In this case, a particle beam, in particular an electron beam, and an etching gas are provided at a site on the photolithographic mask to be etched. The particle beam activates a local chemical reaction between a material of the photolithographic mask and the etching gas, as a result of which material is locally ablated from the photolithographic mask. During the etching method, an electron beam is directed at many discrete points of incidence on the mask in accordance with a grid, said electron beam remaining at a respective grid point for a duration of approximately 100 ns for the purposes of initiating a local etching reaction before said electron beam is directed at the next point of incidence in the grid. Edge regions of defects in particular can only be processed in this way inaccurately in the case of a relatively coarse grid. However, a refinement of the grid leads to large amounts of data during the algorithmic processing of the data since the amount of data grows quadratically with the number of grid points (electron beam points of incidence), that is to say with the decreasing distance between two points of incidence.

Moreover, the edge resolution when processing a defect by use of a particle beam (e.g., an electron beam) depends on the reaction profile of the chemical reaction between the material of the photolithographic mask and the process gas (e.g., etching gas). The reaction profile specifies a region on the mask (e.g., a diameter of a circle around a point of incidence of the particle beam on the mask) in which the chemical reaction occurs. The reaction profile depends inter alia on the beam profile of the particle beam (primary beam) and on the radius of the emerging secondary particles. However, increasing the resolution by way of a refinement of the primary beam (for example by increasing the primary energy) when processing a defect of the photomask is limited by virtue of the fact that a radius of the secondary beam, and hence a radius of the reaction profile, may increase with increasing primary beam energy.

Against this background, it is a general aspect of the present invention to provide an improved method for particle beam-induced processing of a defect of a microlithographic photomask.

According to a first aspect, a method is proposed for particle beam-induced processing of a defect of a microlithographic photomask. The method includes the steps of:

a1) providing an image of at least a portion of the photomask, b1) determining a geometric shape of a defect in the image as a repair shape, c1) subdividing the repair shape into a number of n pixels in accordance with a first rasterization, d1) subdividing the repair shape into a number of m pixels in accordance with a second rasterization, the second rasterization emerging from a subpixel displacement of the first rasterization, e1) providing an activating particle beam and a process gas at each of the n pixels of the repair shape in accordance with the first rasterization, and f1) providing the activating particle beam and the process gas at each of the m pixels of the repair shape in accordance with the second rasterization.

By exposing the photomask in the region of the defect using the particle beam in accordance with two rasterizations displaced relative to one another by a subpixel displacement, it is possible to more finely scan edge regions of the defect in particular.

By way of example, edge regions of the defect can be scanned more finely without refining the rasterization itself. By way of example, a pixel dimension of the n pixels of the repair shape in accordance with the first rasterization is the same as a pixel dimension of the m pixels of the repair shape in accordance with the second rasterization. Expressed differently, the fineness of the rasterization is not altered in this example by the application of the second rasterization of the repair shape. Consequently, the number of pixels, and hence the amount of data, is not changed or is not changed substantially by the application of the second rasterization of the repair shape.

However, the second rasterization may also be finer than the first rasterization in another example in order thus to be able to process the real shape of the defect, in particular its external contour, even better by use of the particle beam.

In particular, the repair shape is subdivided into the n pixels in such a way that the n pixels are arranged in columns (X-direction) and lines (Y-direction, perpendicular to the X-direction).

By way of example, the pixel dimension is a pixel side length and/or a spacing of the centers of two adjacent pixels. By way of example, the pixel dimension is a pixel side length in the X-direction and/or in the Y-direction, and/or a spacing of the centers of two adjacent pixels in the X-direction and/or in the Y-direction.

In particular, both the first rasterization and the second rasterization are grids with grid lines arranged in the X-direction and in the Y-direction in each case. By overlaying the respective grid (corresponding to the first and second rasterization) on the repair shape, the repair shape is subdivided in the n pixels or the m pixels, respectively.

The processing of the defect comprises, in particular, an etching of the defect, within the scope of which material is locally ablated from the photomask, or a deposition of material on the photomask in the region of the defect. By way of example, the proposed method allows a superfluous structure in the region of the defect to be better etched away, or a missing structure in the region of the defect can be better augmented. In particular, the proposed method allows edge regions of the defect to be etched away better and more accurately, or a missing structure in the edge region of the defect can be augmented better and more accurately.

The image of the at least one portion of the photomask is recorded by use of a scanning electron microscope (SEM), for example. By way of example, the image of the at least one portion of the photomask has a spatial resolution of the order of a few nanometers. The image may also be recorded using a scanning probe microscope (SPM), such as, e.g., an atomic force microscope (AFM) or a scanning tunnelling microscope (STM).

The method can in particular include a step of capturing the image of the at least one portion of the photomask by use of a scanning electron microscope and/or a scanning probe microscope.

By way of example, the microlithographic photomask is a photomask for an EUV lithography apparatus. In this case, EUV stands for "extreme ultraviolet" and denotes a wavelength of the working light of between 0.1 nm and 30 nm, in particular 13.5 nm. Within an EUV lithography apparatus, a beam shaping and illumination system is used to guide EUV radiation onto a photomask (also referred to as "reticle"), which in particular is in the form of a reflective optical element (reflective photomask). The photomask has a structure which is imaged onto a wafer or the like in a reduced fashion by use of a projection system of the EUV lithography apparatus.

By way of example, the microlithographic photomask can also be a photomask for a DUV lithography apparatus. In this case DUV stands for "deep ultraviolet" and denotes a wavelength of the working light of between 30 nm and 250 nm, in particular 193 nm or 248 nm. Within a DUV lithography apparatus, a beam shaping and illumination system is used to guide DUV radiation onto a photomask, which in particular is in the form of a transmissive optical element (transmissive photomask). The photomask has a structure which is imaged onto a wafer or the like in a reduced fashion by use of a projection system of the DUV lithography apparatus.

By way of example, the microlithographic photomask comprises a substrate and a structure formed on the substrate by way of a coating. By way of example, the photomask is a transmissive photomask, in the case of which the pattern to be imaged is realized in the form of an absorbing (i.e., opaque or partly opaque) coating on a transparent substrate. Alternatively, the photomask can also be a reflective photomask, for example, especially for use in EUV lithography. The photomask can also be a mask for nanoimprint lithography (NIL).

By way of example, the substrate comprises silicon dioxide ($SiO_2$), for example fused quartz. By way of example, the structured coating comprises chromium, chromium compounds, tantalum compounds and/or compounds made of silicon, nitrogen, oxygen and/or molybdenum. The substrate and/or the coating can also comprise other materials.

In the case of a photomask for an EUV lithography apparatus, the substrate can comprise an alternating sequence of molybdenum and silicon layers.

Using the proposed method, it is possible to identify, locate and repair a defect of a photomask, in particular a defect of a structured coating of the photomask. In particular, a defect is an (e.g., absorbing or reflecting) coating of the photomask that has been applied incorrectly to the substrate. The method can be used to augment the coating at the sites on the photomask where it is lacking. Furthermore, the coating can be removed using the method from sites on the photomask where it had been applied incorrectly.

To this end, a geometric shape of the defect is determined in the recorded image of the at least one portion of the photomask. By way of example, a two-dimensional, geometric shape of the defect is determined. The determined geometric shape of the defect is referred to below as a so-called repair shape.

n pixels corresponding to a first rasterization are defined in the repair shape for the particle beam-induced processing of the repair shape. In step e1) of the method, the particle beam is directed at each of the n pixels of the repair shape. In particular, an intensity maximum of the electron beam is directed at each center of each of the n pixels. Expressed differently, the n pixels of the repair shape represent a first rasterization, in particular a two-dimensional rasterization, of the repair shape for the particle beam-induced processing. By way of example, the n pixels of the repair shape correspond to areas of incidence of the particle beam during the particle beam-induced processing of the defect. By way of example, a pixel dimension is chosen in such a way that an intensity distribution of an electron beam that is directed at a center of a pixel dropped to a predetermined intensity at the edge of the pixel on account of the electron beam's Gaussian intensity distribution. The predetermined intensity may correspond to a drop to half of the intensity maximum or else a drop to any other fraction of the intensity maximum of the electron beam. By way of example, a pixel dimension and/or an electron beam full width at half maximum is in the subnanometer range or of the order of a few nanometers.

m pixels corresponding to a second rasterization are defined in the repair shape in step d1) for the further particle beam-induced processing of the repair shape. In particular, the second rasterization is calculated from the first rasterization in accordance with a subpixel displacement. Step d1) can be performed before or after step e1). Then, the particle beam is directed at each of the m pixels of the repair shape in accordance with the second rasterization in step f1) of the method—in a manner analogous to what was the case for the n pixels in accordance with the first rasterization. In principle, labelling the steps a1), b1), etc. does not specify any particular sequence thereof; rather, the steps may also be carried out in a different sequence. This likewise applies to the method according to the second aspect.

By way of example, the second rasterization has the same degree of fineness as the first rasterization. In this case, the number of n pixels in accordance with the first rasterization does not differ, or does not differ substantially, from the number of m pixels in accordance with the second rasterization. By way of example, in this case the number m differs from the number n by less than 20%, 10%, 5%, 3% and/or 1%. However, the second rasterization may also be finer than the first rasterization in other examples.

By way of example, the process gas is a precursor gas and/or an etching gas. By way of example, the process gas can be a mixture of a plurality of gaseous components, that is to say a process gas mixture. By way of example, the process gas can be a mixture of a plurality of gaseous components, of which each only has a certain molecule type.

In particular, alkyl compounds of main group elements, metals or transition elements can be considered as precursor gases suitable for the deposition or for growing of elevated structures. Examples of this include cyclopentadienyl(trimethyl)platinum (CpPtMe$_3$ Me=CH$_4$), methylcyclopentadienyl(trimethyl)platinum (MeCpPtMe$_3$), tetramethyltin (SnMe$_4$), trimethylgallium (GaMe$_3$), ferrocene (Cp$_2$Fe), bisarylchromium (Ar$_2$Cr), and/or carbonyl compounds of main group elements, metals or transition elements, such as, e.g., chromium hexacarbonyl (Cr(CO)$_6$), molybdenum hexacarbonyl (Mo(CO)$_6$), tungsten hexacarbonyl (W(CO)$_6$), dicobalt octacarbonyl (Co$_2$(CO)$_8$), triruthenium dodecacarbonyl (Ru$_3$(CO)$_{12}$), iron pentacarbonyl (Fe(CO)$_5$), and/or alkoxide compounds of main group elements, metals or transition elements, such as, e.g., tetraethoxysilane (Si(OC$_2$H$_5$)$_4$), tetraisopropoxytitanium (Ti(OC$_3$H$_7$)$_4$), and/or halide compounds of main group elements, metals or transition elements, such as, e.g., tungsten hexafluoride (WF$_6$), tungsten hexachloride (WCl$_6$), titanium tetrachloride (TiCl$_4$), boron trifluoride (BCl$_3$), silicon tetrachloride (SiCl$_4$), and/or complexes with main group elements, metals or transition elements, such as, e.g., copper bis(hexafluoroacetylacetonate) (Cu(C$_5$F$_6$HO$_2$)$_2$), dimethylgold trifluoroacetylacetonate (Me$_2$Au(C$_5$F$_3$H$_4$O$_2$)), and/or organic compounds such as carbon monoxide (CO), carbon dioxide (CO$_2$), aliphatic and/or aromatic hydrocarbons, and more of the same.

By way of example, the etching gas can comprise: xenon difluoride (XeF$_2$), xenon dichloride (XeCl$_2$), xenon tetrachloride (XeCl$_4$), steam (H$_2$O), heavy water (D$_2$O), oxygen (O$_2$), ozone (O$_3$), ammonia (NH$_3$), nitrosyl chloride (NOCl) and/or one of the following halide compounds: XNO, XONO$_2$, X$_2$O, XO$_2$, X$_2$O$_2$, X$_2$O$_4$, X$_2$O$_6$, where X is a halide. Further etching gases for etching one or more of the deposited test structures are specified in U.S. patent application Ser. No. 13/103,281, issued as U.S. Pat. No. 9,721,754 on Aug. 1, 2017, assigned to Carl Zeiss SMT GmbH, the entire content of which is incorporated by reference.

The process gas can comprise further additional gases, for example oxidizing gases such as hydrogen peroxide (H$_2$O$_2$), nitrous oxide (N$_2$O), nitrogen oxide (NO), nitrogen dioxide (NO$_2$), nitric acid (HNO$_3$) and other oxygen-containing gases and/or halides such as chlorine (Cl$_2$), hydrogen chloride (HCl), hydrogen fluoride (HF), iodine (I$_2$), hydrogen iodide (HI), bromine (Br$_2$), hydrogen bromide (HBr), phosphorus trichloride (PCl$_3$), phosphorus pentachloride (PCl$_5$), phosphorus trifluoride (PF$_3$) and other halogen-containing gases and/or reducing gases, such as hydrogen (H$_2$), ammonia (NH$_3$), methane (CH$_4$) and other hydrogen-containing gases. These additional gases can be used, for example, for etching processes, as buffer gases, as passivating media and the like.

By way of example, the activating particle beam is provided with the aid of an apparatus which can comprise: a particle beam source for producing the particle beam; a particle beam guiding device (e.g., scanning unit) configured to direct the particle beam at a respective pixel of the repair shape of the photomask; a particle beam shaping device (e.g., electron or beam optics) configured to shape, in particular focus, the particle beam; at least one storage container configured to store the process gas or at least one gaseous component of the process gas; at least one gas provision device configured to provide the process gas or the at least one gaseous component of the process gas with a predetermined gas quantity flow rate to the respective pixel of the repair shape.

The activating particle beam for example comprises an electron beam, an ion beam and/or a laser beam.

By way of example, an electron beam is provided with the aid of a modified scanning electron microscope. By way of example, the image of the at least one portion of the photomask is recorded using the same modified scanning electron microscope that provides the activating electron beam.

The activating particle beam activates, in particular, a local chemical reaction between a material of the photomask and the process gas, which leads locally to a deposition of material on the photomask from the gas phase or to a transition of material of the photomask into the gas phase.

The activating particle beam is successively provided at each of the n pixels of the repair shape according to the first rasterization in step e1), for example by use of the particle beam guiding device. In step e1) of the method according to the first aspect, the activating particle beam remains at each pixel for a predetermined dwell time in order to initiate the chemical reaction between the process gas and the mask material at the location of the respective pixel. By way of example, the dwell time is 100 ns. Furthermore, the activating particle beam is successively provided at each of the m pixels of the repair shape according to the second rasterization in step f1), for example by use of the particle beam guiding device, in order to initiate said chemical reaction. In step f1) of the method according to the first aspect, the activating particle beam remains on each pixel for a predetermined dwell time of 100 ns, for example.

However, the dwell time can also adopt other values. By way of example, the dwell time of the activating particle beam at each pixel in accordance with the first or the second rasterization in step e1) or f1) is less than or equal to 500 ns, less than or equal to 400 ns, less than or equal to 300 ns, less than or equal to 200 ns, less than or equal to 100 ns and/or less than or equal to 50 ns.

According to an embodiment, the subpixel displacement is a displacement, more particularly a lateral displacement, of the first rasterization by a subpixel dimension.

As a result, the second rasterization of the repair shape can easily be determined, for example calculated, from the first rasterization.

In particular, a subpixel dimension is a fraction of a pixel dimension. By way of example, a subpixel dimension is a fraction of a pixel side length (e.g., in the X-direction and/or in the Y-direction) and/or a spacing of the centers of two adjacent pixels (e.g., in the X-direction and/or in the Y-direction).

By way of example, the lateral displacement is a displacement (in particular a transverse displacement) in a first direction (X-direction) or in a second direction (Y-direction) perpendicular to the first direction.

In particular, the grid lines of the first rasterization are displaced, in particular displaced laterally, relative to the repair shape by the subpixel dimension in order to form the grid lines of the second rasterization. In this case, pixels according to the first rasterization may now for example be located outside of the repair shape and are consequently not considered according to the second rasterization. Furthermore, "free grid spaces" of the first rasterization may now also be filled with pixels according to the second rasterization.

According to a further embodiment, the method includes the steps of:

subdividing the repair shape into a number of $l_i$ pixels in accordance with at least one further rasterization, with an i-th further rasterization being subdivided into $l_i$ pixels and the at least one further rasterization emerging from a subpixel displacement of the first, the second or any other one of the at least one further rasterization, and providing the activating particle beam and the process gas at each of the $l_i$ pixels of the repair shape in accordance with the at least one further rasterization.

Edge regions of the defect can be processed even better by use of the particle beam by way of one or more further rasterizations that differ from the first and the second rasterization. In particular, an accuracy of the position of an edge can be increased during the repair of the defect.

According to a further embodiment, step e1) is repeated before step f1) with a number g of repetition cycles and/or step f1) is repeated with a number h of repetition cycles.

In particular, g and h are integers greater than or equal to two. In this case, the number g of repetition cycles can equal the number h of repetition cycles (g=h) or these may differ from one another (g≉h).

Consequently, all pixels n of the repair shape according to the first rasterization are repeatedly exposed (g repetition cycles) with the electron beam in step e1) for example before there is a transition to the processing of the defect of the photomask in accordance with the second rasterization. By way of example, step e1) is carried out with a number of 10 or 100 repetition cycles (i.e., g=10 or g=100). However, the number g of repetition cycles may also adopt any other value.

Furthermore, all pixels m of the repair shape according to the second rasterization are also exposed repeatedly (h repetition cycles) with the electron beam in step f1) for example. By way of example, the number of repetition cycles his also 10 or 100. However, the number h of repetition cycles may also adopt any other value.

According to a further embodiment, steps e1) and f1) are repeated with a number j of repetition cycles.

In particular, j is an integer greater than or equal to two. By way of example, the number j of repetition cycles may be of the order of 100, 1000, 10 000, 100 000 or one million.

By way of example, the defect can be fully repaired by the repeated processing of the defect of the photomask using the particle beam.

By way of example, as a result each of the n pixels of the repair shape according to the first rasterization is exposed (g×j)-times by the particle beam. By way of example, each of the m pixels of the repair shape according to the second rasterization is exposed (h×j)-times by the particle beam.

According to a further embodiment, the activating particle beam is in each case provided successively in a sequence at the n pixels, the m pixels and/or the $l_i$ pixels of the repair shape, in which sequence a depletion of the process gas is implemented uniformly over the repair shape by a chemical reaction activated by the activating particle beam.

In particular, it is possible to avoid line-by-line scanning of the repair shape, within the scope of which each pixel is homed in on. By way of example, only every r-th pixel is homed in on along a line (e.g., along an X-direction) initially, where r is an integer greater than or equal to 1. By way of example, every pixel (r=1), every second pixel (r=2) or every third pixel (r=3) is homed in on along a line. By way of example, only every s-th pixel is homed in on along a column (e.g., along a Y-direction), where s is an integer greater than or equal to 1. By way of example, an offset along a column is greater than an offset along a line (i.e., s is greater than r). By way of example, every fifth pixel (s=5) or every tenth (s=10) pixel is homed in on along a column. In further iterations, the further pixels of the repair shape are then exposed in a similar manner by use of the particle beam until all pixels n of the repair shape in accordance with the first rasterization or all pixels m of the repair shape in accordance with the second rasterization or all pixels $l_i$ of the repair shape in accordance with the further rasterization were exposed once.

In embodiments, the sequence in which the activating particle beam is respectively successively provided at the n pixels, the m pixels and/or the $l_i$ pixels of the repair shape may also have a random distribution.

According to a second aspect, a method is proposed for particle beam-induced processing of a defect of a micro-lithographic photomask. The method includes the steps of:

a2) providing an image of at least a portion of the photomask, b2) determining a geometric shape of a defect in the image as a repair shape, and c2) providing a process gas at least along a stretch of the repair shape and guiding an activating particle beam along the stretch while simultaneously activating a chemical reaction between the process gas and a material of the photomask on the stretch.

As a result of the particle beam being guided along the stretch of the repair shape with the chemical reaction between the process gas and the mask material being activated at the same time, a discrete scanning of individual pixels of the repair shape, that is to say scanning in accordance with a rasterization, is avoided. Rather, the particle beam is guided in a vectorial representation along the stretch of the repair shape. Hence the defect, in particular its edge regions, can be repaired better and more accurately. In particular, the resolution with which the defect can be processed is not dependent on a resolution (fineness) of a rasterization but only dependent on the resolution (i.e., control accuracy) with which an apparatus for particle beam-induced processing is able to control the particle beam.

Steps a2) and b2) of the method according to the second aspect correspond in particular to steps a1) and b1) of the method according to the first aspect. Furthermore, the provision of the process gas in step c2) of the method according to the second aspect, for example, is also implemented in a manner similar to the provision of the process gas in step e1) and f1) of the method according to the first aspect.

Moreover, the provision of the particle beam in step c2) of the method according to the second aspect in respect of the apparatus for particle beam-induced processing, in respect of the generation of the particle beam and its basic effect on the process gas, for example, is also implemented in a manner similar to the provision of the particle beam in step e1) and f1) of the method according to the first aspect.

According to a further embodiment, the activating particle beam is guided with a speed greater than zero along the entire stretch and/or the activating particle beam is guided along the entire stretch without stopping.

As a result of stopping (dwelling) of individual pixels for a dwell time being omitted in the method according to the second aspect, the desired particle beam dose (e.g., electron beam dose) can be set by way of the choice of the speed with which the activating particle beam is guided over the surface of the defect. Furthermore, a temporal change in the composition of the provided process gas, e.g. of the etching gas, can also be influenced by the choice of the sweep speed. In particular, this can also prevent a disadvantageous gas composition and hence, for example, a greatly reduced processing rate (e.g., etching rate) on account of a disadvantageous gas composition. Consequently, a defect can be better removed, for example completely to its external contour.

By way of example, the particle beam is guided from a starting point of the stretch to an end point of the stretch at a speed greater than zero and/or without stopping.

According to a further embodiment, a length of the stretch is greater than or equal to 5 nm, greater than or equal to 10 nm, greater than or equal to 20 nm, greater than or equal to 50 nm, greater than or equal to 100 nm, greater than or equal to 200 nm and/or greater than or equal to 500 nm.

According to a further embodiment, the stretch extends linearly from one edge of the repair shape to an opposite edge of the repair shape.

By way of example, the particle beam is guided over the repair shape in a "serpentine pattern." In this case, the particle beam is for example guided linearly along a first stretch from a first starting point at a first edge of the repair shape to a first end point at a second edge of the repair shape opposite to the first edge. By way of example, the first stretch connects the first starting point and the first end point on the shortest path. Subsequently, the particle beam is offset to a new second starting point at the second edge, for example in a direction perpendicular to the first stretch at the second edge. Then, the particle beam is guided, for example along a second stretch, from the second starting point at the second edge of the repair shape to a second end point at the first edge. The second stretch connects the second starting point and the second end point, for example on the shortest path, and is arranged parallel to the first stretch. In a corresponding manner, the entire repair shape can be swept by the particle beam on a plurality of individual stretches.

By way of example, what applies to each of the individual stretches is that the activating particle beam is guided with a speed greater than zero along the entire individual stretch and/or the activating particle beam is guided along the entire individual stretch without stopping (dwelling).

A distance between a first end point and a second starting point can be chosen in such a way (e.g., increased) that an advantageous particle beam dose is present and/or there is no disadvantageous change in the gas composition of the process gas. If processing gaps perpendicular to a first and second stretch arise on account of a large spacing, the particle beam can return to these processing gaps in a further iteration. However, this case may lead to a disadvantageous particle beam dose, in particular in an edge region of the defect and more particularly in an edge region of the defect that is arranged perpendicular or approximately perpendicular to the first and the second edge.

According to a further embodiment, the stretch extends along an outer edge of the repair shape and/or along a parallel curve parallel to the outer edge of the repair shape.

As a result, it is possible to avoid a disadvantageous particle beam dose, particularly in an edge region of the defect.

By way of example, the particle beam is guided over the repair shape in a (quasi) "spiral pattern." In this case, the particle beam is guided, for example, from a first starting point at an outer edge of the repair shape along a first stretch, which leads along the outer edge of the repair shape, to a first end point at the outer edge. In this case, the first end point coincides with the first starting point or is arranged adjacent to the latter. Subsequently, the particle beam is offset radially inwardly from the outer edge (e.g., in the direction of a center of the repair shape) to a second starting point, for example. Then the particle beam is guided for example from the second starting point along a second stretch, which extends along a parallel curve parallel to the first stretch, to a second end point on the parallel curve. In a corresponding manner, the entire repair shape can be swept by the particle beam on a plurality of individual stretches which extend along parallel curves parallel to the outer edge.

By way of example, what applies to each of the individual stretches is that the activating particle beam is guided with a speed greater than zero along the entire individual stretch and/or the activating particle beam is guided along the entire individual stretch without stopping (dwelling).

According to a further embodiment, the repair shape is subdivided into at least a first and a second sub-repair shape.

Moreover, the stretch extends linearly from an edge of the first sub-repair shape to an opposite edge of the first sub-repair shape, and/or the stretch extends along an outer edge of the second sub-repair shape and/or along a parallel curve parallel to the outer edge of the second sub-repair shape.

By way of example, the first sub-repair shape is an inner region of the repair shape and the second sub-repair shape surrounds the inner first sub-repair shape.

In embodiments, the repair shape is subdivided into sub-repair shapes in two or more differing subdivisions. This can avoid uneven processing of the defect at the boundaries between the sub-repair shapes.

According to a further embodiment, the activating particle beam is guided along the stretch with a speed greater than or equal to 0.01 m/s, greater than or equal to 0.02 m/s, greater than or equal to 0.03 m/s, greater than or equal to 0.05 m/s, greater than or equal to 0.1 m/s, greater than or equal to 1 m/s, greater than or equal to 5 m/s, greater than or equal to 10 m/s, greater than or equal to 50 m/s and/or greater than or equal to 100 m/s.

Hence, the activating particle beam can be guided fast enough along the stretch such that a particle beam dose that is as homogeneous as possible is present over the entire repair shape, and in particular also in edge regions of the repair shape.

According to a further embodiment, the activating particle beam is guided over the entire repair shape in less than or equal to 500 ns, less than or equal to 400 ns, less than or equal to 300 ns, less than or equal to 200 ns, less than or equal to 100 ns and/or less than or equal to 50 ns.

In other embodiments, the activating particle beam may also be guided more slowly over the entire repair shape.

According to a further embodiment, a beam current of the activating particle beam is greater than or equal to 0.0001 µA, greater than or equal to 0.001 µA, greater than or equal to 0.01 µA, greater than or equal to 0.1 µA and/or greater than or equal to 1 µA.

As a result of a higher beam current in the method according to the second aspect, in which the repair shape is swept vectorially (instead of being scanned discretely and pixel-by-pixel by the particle beam like in the method according to the first aspect), it is possible to apply the required particle beam dose (e.g., electron beam dose) even in the case of high sweep speeds.

However, a beam current of the activating particle beam may also have smaller values in other embodiments. By way of example, a beam current of the activating particle beam may also be greater than or equal to 1 pA and/or greater than or equal to 10 pA.

According to a further aspect, a computer program product is proposed, said computer program product comprising instructions which, when executed by a computing apparatus for controlling an apparatus for particle beam-induced processing of a defect of a microlithographic photomask, prompt the apparatus to carry out the above-described method according to the first aspect and/or the above-described method according to the second aspect.

"A(n)" in the present case should not necessarily be understood to be restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the invention also comprise not explicitly mentioned combinations of any features or embodiments that are described above or below with respect to the exemplary embodiments. In this case, a person skilled in the art will also add individual aspects as improvements or supplementations to the respective basic form of the invention.

Further advantageous embodiments and aspects of the invention are the subject matter of the dependent claims and also of the exemplary embodiments of the invention described below. The invention is elucidated in detail hereinafter by preferred embodiments with reference to the appended figures.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 9 shows a further example of a defect of the photomask from FIG. 1, with a geometric shape (repair shape) of the defect not being subdivided into pixels but with a particle beam travelling over the repair shape continuously and vectorially along a plurality of stretches from one edge to the other edge of the repair shape;

FIG. 10 shows a further example of a defect of the photomask from FIG. 1, with a geometric shape (repair shape) of the defect not being subdivided into pixels but with a particle beam travelling over the repair shape continuously and vectorially along a plurality of stretches extending parallel to an outer contour of the repair shape;

FIG. 11 shows the defect from FIG. 10, with the repair shape being subdivided into two sub-repair shapes, in which the method from FIG. 9 is applied to the inner of the two sub-repair shapes and the method from FIG. 10 is applied to an outer of the two sub-repair shapes.

DETAILED DESCRIPTION

Unless indicated otherwise, elements that are the same or functionally the same have been given the same reference signs in the figures. It should also be noted that the illustrations in the figures are not necessarily true to scale.

Figure 1:
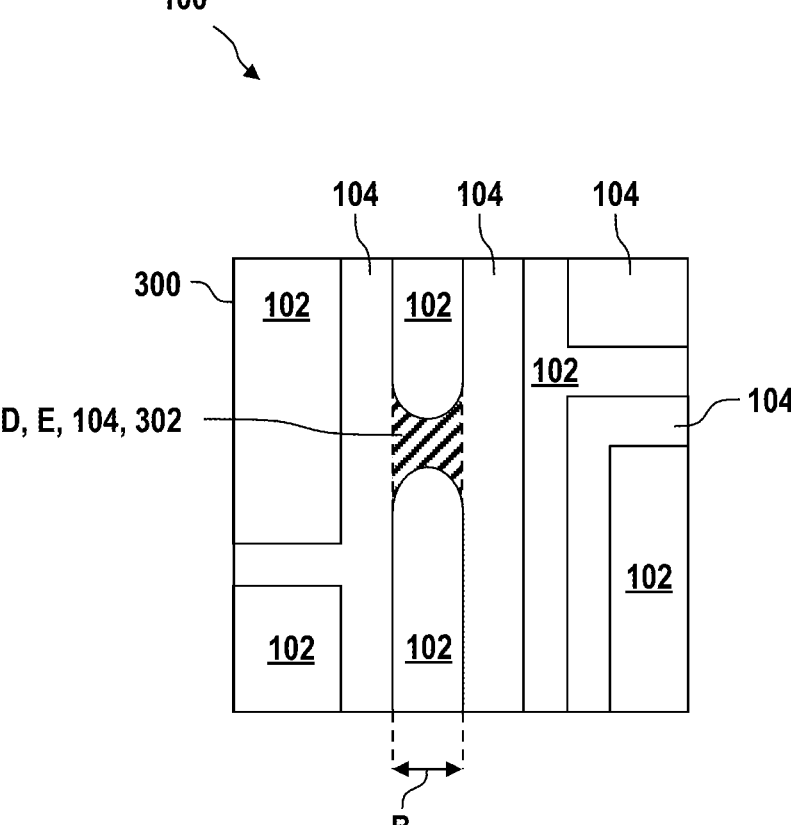
FIG. 1 schematically shows a detail of a microlithographic photomask having a defect in a structured coating according to one embodiment.

FIG. 1 schematically shows a detail of a microlithographic photomask 100. In the example shown, the photomask 100 is a transmissive photolithographic mask 100. The photomask 100 comprises a substrate 102. The substrate 102 is optically transparent, especially at the wavelength with which the photomask 100 is exposed. By way of example, a material of the substrate 100 comprises fused quartz.

A structured coating 104 (pattern elements 104) has been applied to the substrate 102. In particular, the coating 104 is a coating made of an absorbing material. By way of example, a material of the coating 104 comprises a chromium layer. By way of example, a thickness of the coating 104 ranges from 50 nm to 100 nm. A structure dimension B of the structure formed by the coating 104 on the substrate 102 of the photomask 100 may differ at various positions of the photomask 100. By way of example, the width B of a region is plotted as structure dimension in FIG. 1. By way of example, the structure dimension B lies in a region of 20 to 200 nm. The structure dimension B may also be greater than 200 nm, for example be of the order of micrometers.

In other examples, other materials and other layer thicknesses (for example thinner layer thicknesses, e.g., "thin EUV mask absorber") to the ones mentioned can also be used for the substrate and the coating. Furthermore, the photomask 100 can also be a reflective photomask rather than a transmissive photomask.

Occasionally, defects D can arise during the production of photomasks, for example because etching processes do not run exactly as intended. In FIG. 1, such a defect D is represented by hatching. This is excess material since the coating 104 was not removed from this region even though the two coating regions 104 next to one another are envisaged as separate in the template for the photomask 100. One could also say that the defect D forms a web. In this case, a dimension of the defect D corresponds to the structure dimension B. Other defects which are smaller than the structure dimension B, for example of an order of 5 to 20 nm, are also known. To ensure that a structure produced in a lithography apparatus using the photomask has the desired shape on a wafer and hence the semiconductor component produced in this way fulfils the desired function, it is necessary to repair defects, such as the defect D shown in FIG. 1 or else other defects. In this example, it is necessary to remove the web in a targeted manner, for example by particle beam-induced etching.

Figure 2:
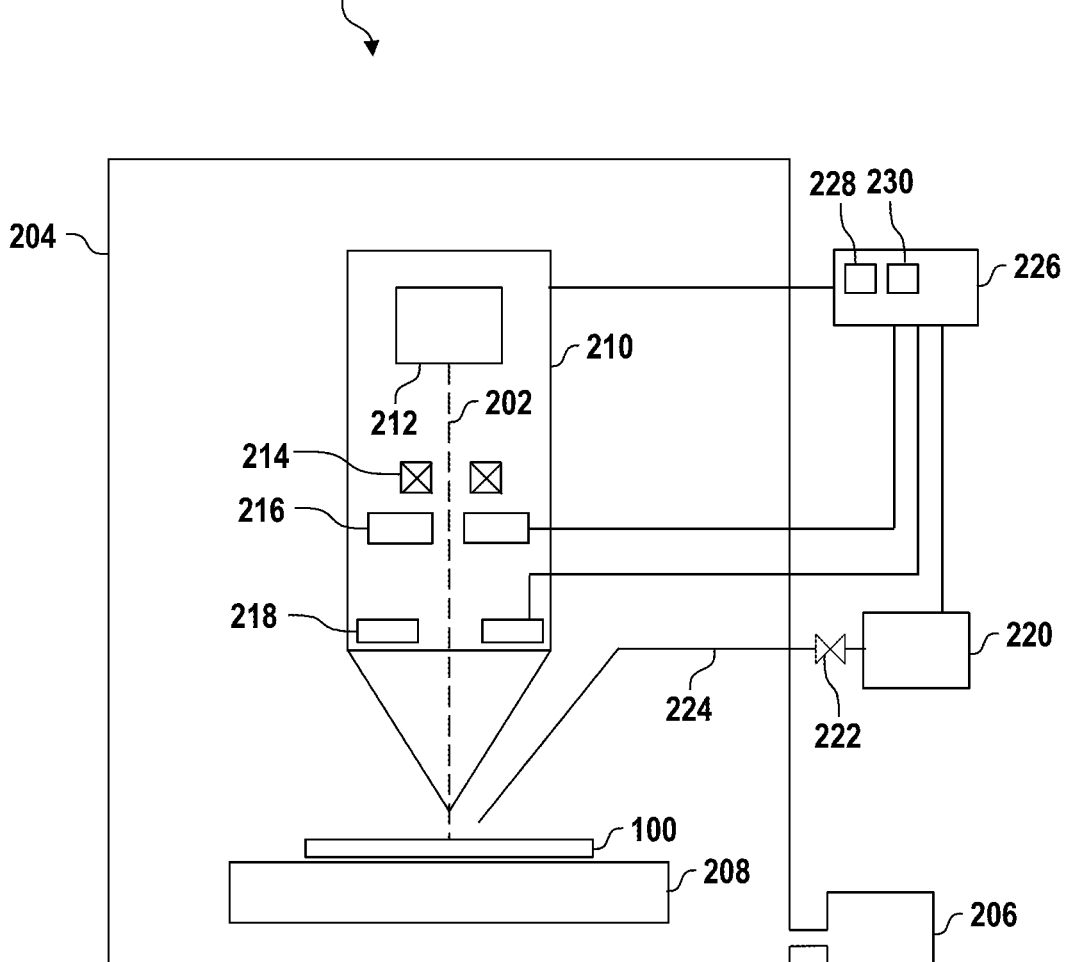
FIG. 2 shows an apparatus for particle beam-induced processing of the defect of the photomask from FIG. 1 according to one embodiment.

FIG. 2 shows an apparatus 200 for particle beam-induced processing of a defect of a microlithographic photomask, for example the defect D of the photomask 100 from FIG. 1. FIG. 2 shows schematically the section through a few components of the apparatus 200 which can be used for particle beam-induced repairing, in this case etching, of the defect D of the photomask 100. Moreover, the apparatus 200 can also be used for imaging the photomask, in particular the structured coating 104 of the mask 100 and of the defect D before, during and after the implementation of a repair process.

The apparatus 200 shown in FIG. 2 represents a modified scanning electron microscope 200. In this case, a particle beam 202 in the form of an electron beam 202 is used to repair the defect D. The use of an electron beam 202 as activating particle beam has the advantage that the electron beam 202 substantially cannot damage, or can only slightly damage, the photomask 100, in particular the substrate 102 thereof.

A laser beam for activating a local particle beam-induced repair process for the photomask 100 can be used instead of the electron beam 202 or in addition to the electron beam 202 in embodiments (not shown in FIG. 2). Further, instead of an electron beam and/or a laser beam, it is possible to use an ion beam, an atom beam and/or a molecule beam for activating a local chemical reaction (not shown in FIG. 2).

The apparatus 200 is largely arranged in a vacuum housing 204, which is kept at a certain gas pressure by a vacuum pump 206.

By way of example, the apparatus 200 is a repair tool for microlithographic photomasks, for example for photomasks for a DUV or EUV lithography apparatus.

A photomask 100 to be processed is arranged on a sample stage 208. By way of example, the sample stage 208 is configured to set the position of the photomask 100 in three spatial directions and for example additionally in three axes of rotation with an accuracy of a few nanometers.

The apparatus 200 comprises an electron column 210. The electron column 210 comprises an electron source 212 for providing the activating electron beam 202. Furthermore, the electron column 210 comprises electron or beam optics 214. The electron source 212 produces the electron beam 202 and the electron or beam optics 214 focus the electron beam 202 and direct the latter to the photomask 100 at the output of the column 210. The electron column 210 moreover comprises a deflection unit 216 (scanning unit 216) which is configured to guide (scan) the electron beam 202 over the surface of the photomask 100. Instead of the deflection unit 216 (scanning unit 216) arranged within the column 210, use can also be made of a deflection unit (scanning unit) (not shown) arranged outside of the column 210.

The apparatus 200 furthermore comprises a detector 218 for detecting the secondary electrons and/or backscattered electrons produced at the photomask 200 by the incident electron beam 202. By way of example, as shown, the detector 218 is arranged around the electron beam 202 in ring-shaped fashion within the electron column 210. As an alternative and/or in addition to the detector 218, the apparatus 200 can also contain other/further detectors for detecting secondary electrons and/or backscattered electrons (not shown in FIG. 2).

Moreover, the apparatus 200 can comprise one or more scanning probe microscopes, for example atomic force microscopes, which can be used to analyze the defect D of the photomask 100 (not shown in FIG. 2).

The apparatus 200 furthermore comprises a gas provision unit 220 for supplying process gas to the surface of the photomask 100. By way of example, the gas provision unit 220 comprises a valve 222 and a gas line 224. The electron beam 202 directed at a location on the surface of the photomask 100 by the electron column 210 can carry out electron-beam induced processing (EBIP) in conjunction with the process gas supplied by the gas provision unit 220 from the outside via the valve 222 and the gas line 224. In particular, said process comprises a deposition and/or an etching of material.

The apparatus 200 moreover comprises a computing apparatus 226, for example a computer, having a control device 228 and a determination device 230. In the example of FIG. 2, the computing apparatus 226 is arranged outside of the vacuum housing 204.

The computing apparatus 226, in particular the control device 228, serves to control the apparatus 200. In particular, the computing apparatus 226, in particular the control device 228, controls the provision of the electron beam 202 by way of driving the electron column 210. In particular, the computing apparatus 226, in particular the control device 228, controls the guidance of the electron beam 202 over the surface of the photomask 100 by driving the scanning unit 216. Moreover, the computing apparatus 226 controls the provision of the process gas by driving the gas provision unit 220.

Moreover, the computing apparatus 226 receives measured data from the detector 218 and/or other detectors of the apparatus 200 and produces images from the measurement data, which images can be displayed on a monitor (not shown). Moreover, images produced from the measured data can be stored in a memory unit (not shown) of the computing apparatus 226.

To check the photomask 100 and, in particular, the structured coating 104 of the photomask 100, the apparatus 200 is configured, in particular, to capture an image 300 of the photomask 100 (FIG. 1) or an image 300 of a detail of the photomask 100 from measured data from the detector 218 and/or other detectors of the apparatus 200. By way of example, a spatial resolution of the image 300 is of the order of a few nanometers.

The computing apparatus 226, in particular the determination device 230, is configured to recognize a defect D (FIG. 1) in the recorded image 300, to locate said defect and to determine a geometric shape 302 (repair shape 302) of the defect D. The determined geometric shape 302 of the defect D, that is to say the repair shape 302, is a two-dimensional geometric shape for example.

FIGS. 3 to 7 elucidate a method according to a first aspect for the particle beam-induced processing of a further example of a defect D' of a structured coating 104 of the photomask 100 from FIG. 1. By way of example, the method is carried out using the apparatus shown in FIG. 2.

As described above in conjunction with FIGS. 1 and 2, an image 300 of at least a portion of the photomask 100 (FIG. 1) is recorded in step S1 of the method according to the first aspect.

Figure 3:
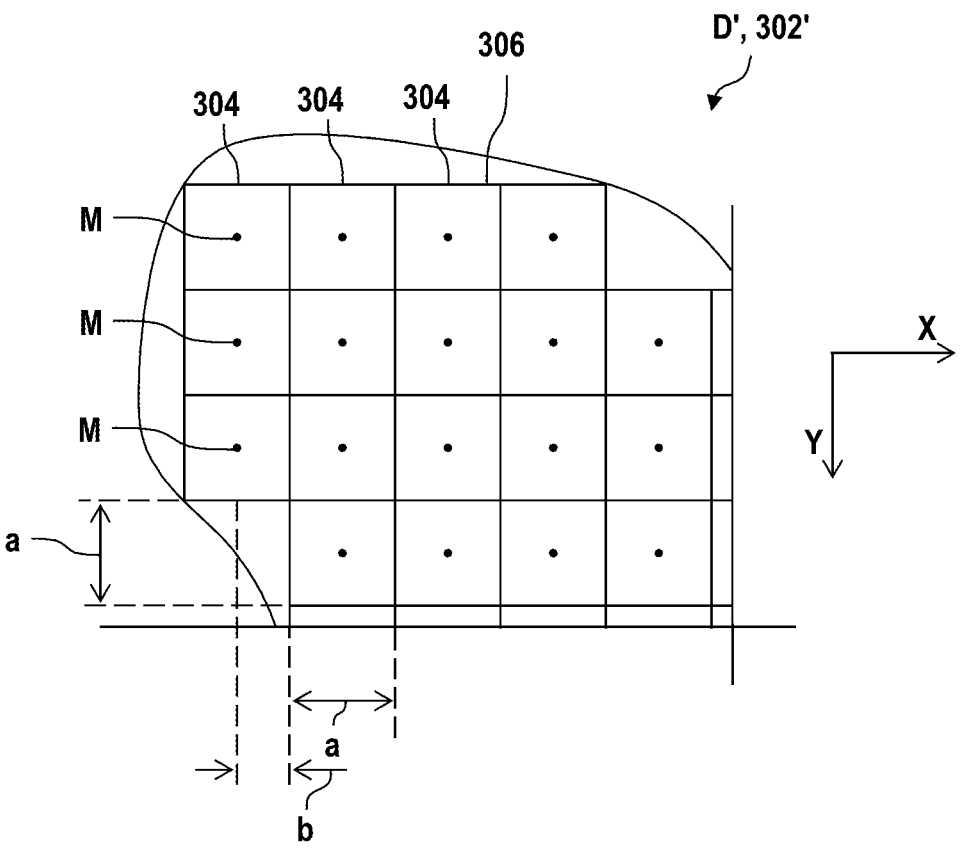
FIG. 3 shows a partial detail of a further example of a defect of the photomask from FIG. 1, with a geometric shape (repair shape) of the defect being subdivided into a plurality of pixels in accordance with a first rasterization.

As described above in conjunction with FIGS. 1 and 2, a geometric shape of a defect D' is determined in the image 300 as a repair shape 302' in step S2 of the method according to the first aspect. FIG. 3 shows a partial detail of the defect D'.

The repair shape 302' (FIG. 3) is subdivided into a number of n pixels 304 in accordance with a first rasterization 306 in step S3 of the method according to the first aspect. In particular, the computing apparatus 226 (FIG. 2), more particularly the determination device 230, is configured to divide the repair shape 302' (FIG. 3) into the number of n pixels 304 in accordance with the first rasterization 306.

In FIG. 3, three pixels 304 of the repair shape 302' have been provided with a reference sign in an exemplary manner. In particular, the pixels 304 are arranged in columns (X direction) and lines (Y-direction, perpendicular to the X-direction). Each pixel 304 has a center M, three of the pixels being provided in FIG. 3 with a reference sign in an exemplary manner. FIG. 3 shows only a very small detail of the repair shape 302'. By way of example, the entire repair shape 302' comprises 1 million pixels 304 (n=1 000 000). By way of example, a side length a of the pixels 304 is a few nanometers, for example 1.5 nm. By way of example, the pixels 304 have an area of 1.5 nm×1.5 nm. During the course of a repair method, the electron beam 202 (FIG. 2) is directed at the center M of each pixel 304 multiple times by use of the scanning unit 216. In particular, an intensity maximum of the for example Gaussian intensity profile of the electron beam 202 is directed at each center M of each pixel 304 multiple times over the course of the method. The number of pixels that the repair shape has, and the side length of each pixel, can be different from the exemplary values provided above.

Figure 4:
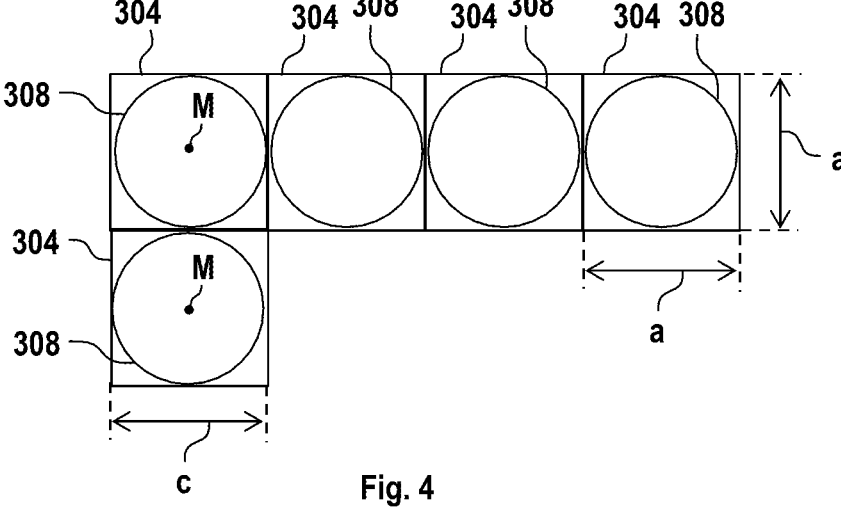
FIG. 4 shows five pixels from FIG. 3 in a magnified view.

FIG. 4 shows a magnified view of five of the pixels 304 of the repair shape 302' shown in FIG. 3. Each pixel 304 has a square shape with a side length a. Consequently, the distance between two adjacent pixel centers M also equals a. The circles with diameter c and denoted by reference sign 308 represent areas of incidence of the electron beam 202 (FIG. 2) on the surface of the photomask 100. In this case, the diameter c corresponds to the side length a. The electron beam 202 has a radially symmetric Gaussian intensity profile, for example. In particular, the electron beam 202 is directed at a center M of the area of incidence 308 or of the pixel 304 such that a maximum of the intensity distribution thereof is incident on the center M within the scope of what is technically possible. By way of example, the areas of incidence 308 may correspond to a full width at half maximum of the intensity profile of the electron beam 202. However, the areas of incidence 308 may also correspond to any other intensity dropped from the maximum of the intensity distribution of the electron beam 202.

In step S4 of the method according to the first aspect, the repair shape 302' (FIG. 3) is scanned by use of the electron beam 202 and with provision of the process gas such that the defect D', the geometric shape of which is the repair shape 302', is processed and rectified under the control of the computing apparatus 226 (FIG. 2), more particularly the control device 228. In this case, the activating electron beam 202 is successively directed at each of the n pixels 304 of the repair shape 302'. The electron beam 202 dwells at each of the n pixels 304 of the repair shape 302' for a predetermined dwell time. In this case, a chemical reaction of the process gas is activated at each of the n pixels 304 of the repair shape 302' by way of the electron beam 202. By way of example, the process gas comprises an etching gas. By way of example, the chemical reaction leads to volatile reaction products with the material of the defect D' to be etched arising, which are at least partly gaseous at room temperature and which can be pumped away using a pump system (not shown).

After the electron beam 202 has been directed at each of the n pixels 304 of the repair shape 302 once (step e1)), this procedure is repeated over a number g of repetition cycles.

The repair shape 302' is subdivided into a number of m pixels 304' in accordance with a second rasterization 306' (FIG. 5) in step S5 of the method according to the first aspect. In particular, the computing apparatus 226, more particularly the determination device 230, is configured to calculate the second rasterization from the first rasterization.

Step S5 can be performed before or after step S4.

Figure 5:
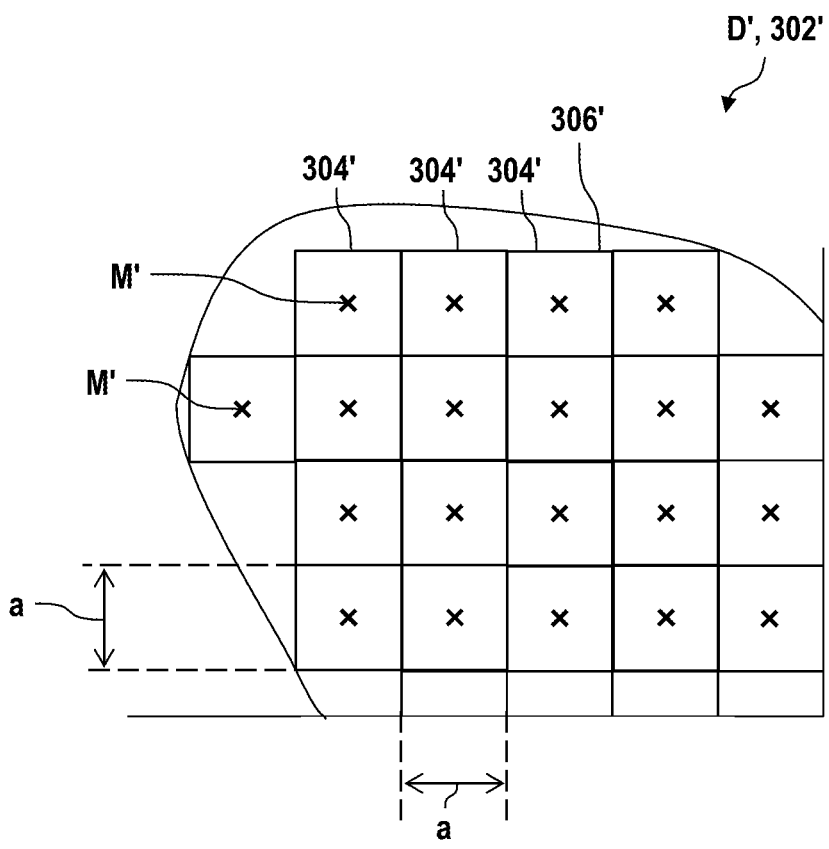
FIG. 5 shows a view similar to FIG. 3, with the geometric shape (repair shape) of the defect being subdivided into a plurality of pixels in accordance with a second rasterization.

FIG. 5 shows the same detail of the repair shape 302' as FIG. 3. However, in contrast to FIG. 3, the repair shape 302' is subdivided into m pixels 304' in accordance with the second rasterization 306' in FIG. 5. In particular, the second rasterization 306' is calculated from the first rasterization 306 (FIG. 3) in accordance with a subpixel displacement. In particular, to form the second grid 306' (FIG. 5), the first grid 306 (FIG. 3) was displaced to the right in FIGS. 3 and 4 by a length b, which corresponds to half a pixel length a in the example shown. In the example shown, the second rasterization 306' has the same degree of fineness as the first rasterization 306. In particular, the pixels 304' (FIG. 5) according to the second rasterization 306' have the same dimension (pixel side length a) as the pixels 304 according to the first rasterization 306 (FIG. 3).

Then, the particle beam 202 is directed at each of the m pixels 304' of the repair shape 302' in accordance with the second rasterization 306' in step S6 of the method according to the first aspect—in a manner analogous to what was the case for the n pixels 304 in accordance with the first rasterization 306.

Figure 6:
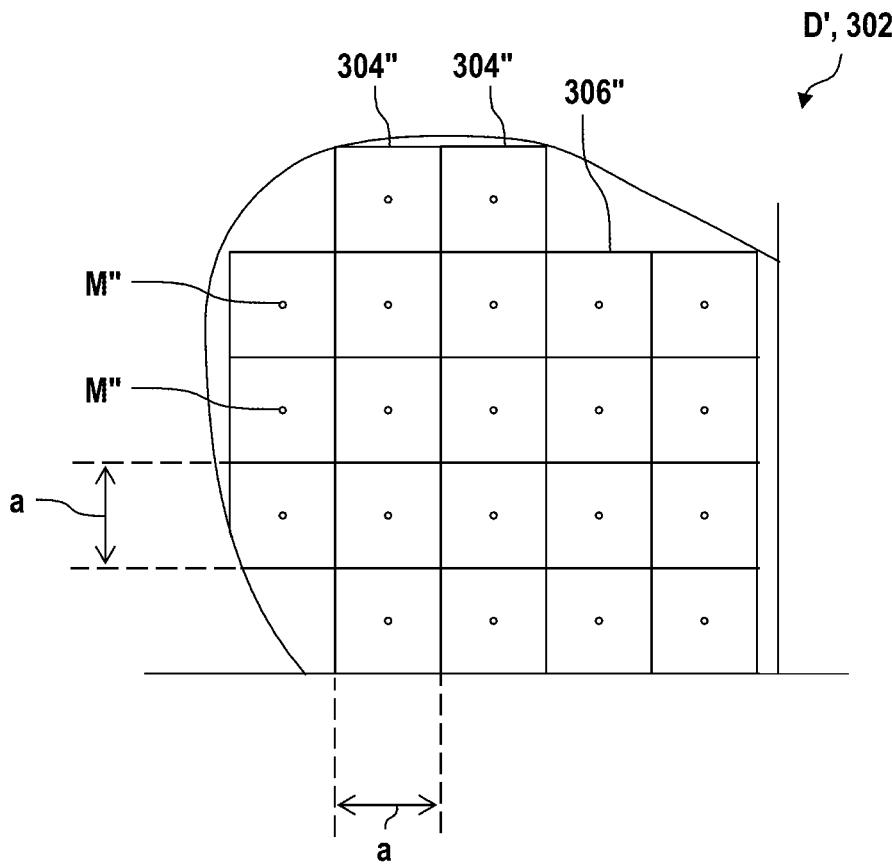
FIG. 6 shows a view similar to FIG. 3, with the geometric shape (repair shape) of the defect being subdivided into a plurality of pixels in accordance with a third rasterization.

In a step S7 of the method according to the first aspect, step S5 is carried out for one or more further rasterizations 306" that differ from the first and the second rasterization 306, 306'. By way of example, FIG. 6 shows a third rasterization 306", which emerges from the second rasterization 306' by way of an upward displacement by half a pixel length a in FIGS. 5 and 6. That is to say the repair shape 302' was subdivided into a number of l pixels 304" in accordance with the third rasterization 306". In the example shown, the pixels 304" have the same dimension, that is to say side length a, as the pixels 304 (FIG. 3) and the pixels 304' (FIG. 5). The second and/or the third rasterization 306', 306" may also be finer than the first rasterization 306 in other examples. In this case, the pixels 304' and/or 304" would have a smaller side length than the pixels 304.

In a step S8 of the method according to the first aspect, step S6 is carried out for the one or more further rasterizations 306". By way of example, the activating particle beam 202 and the process gas are provided at each of the l pixels 304" of the repair shape 302' in accordance with the third rasterization 306" (FIG. 6).

Figure 7:
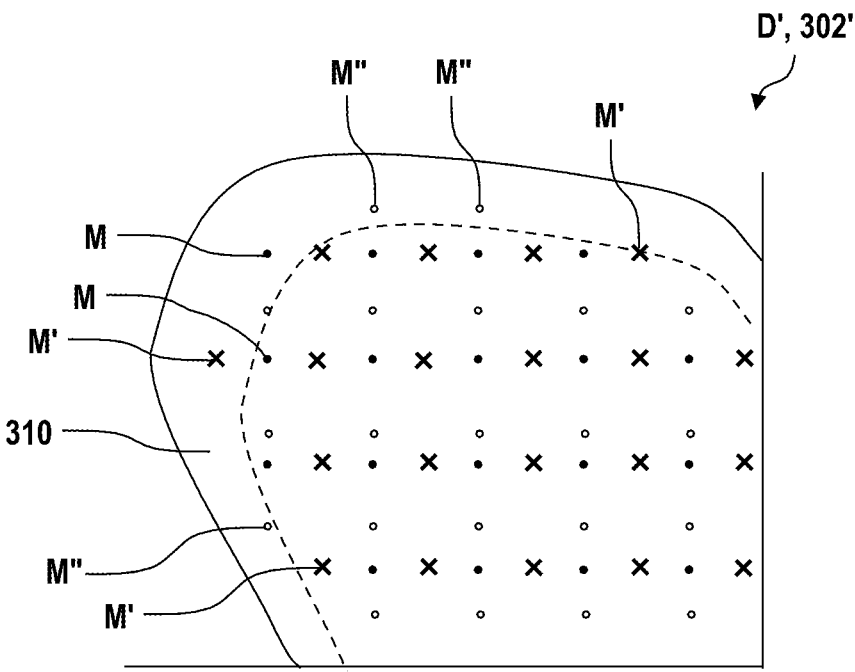
FIG. 7 shows a view similar to FIG. 3, with the centers of the pixels according to the first, second and third rasterization being depicted overlaid on one another.
Figure 8:
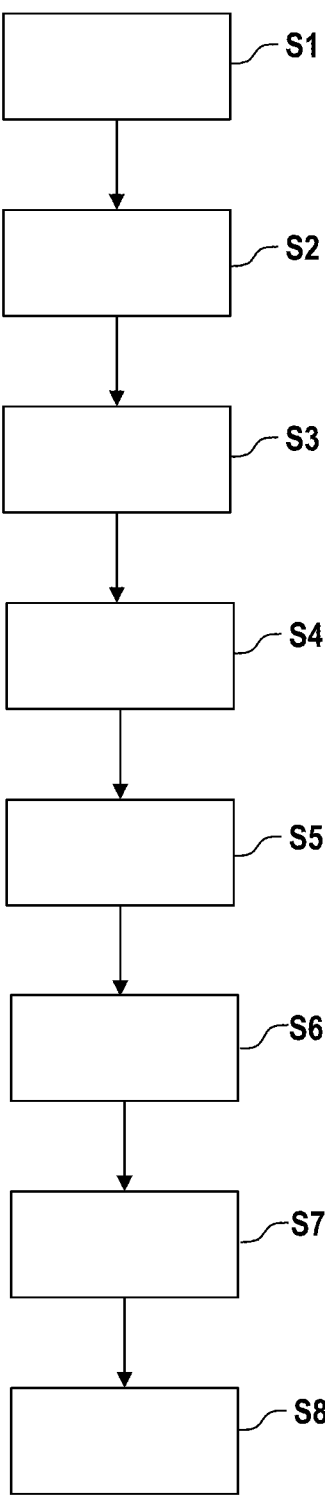
FIG. 8 shows a flowchart of a method for particle beam-induced processing of a defect of the photomask from FIGS. 1 to 7 in accordance with a first aspect.
Figure 12:
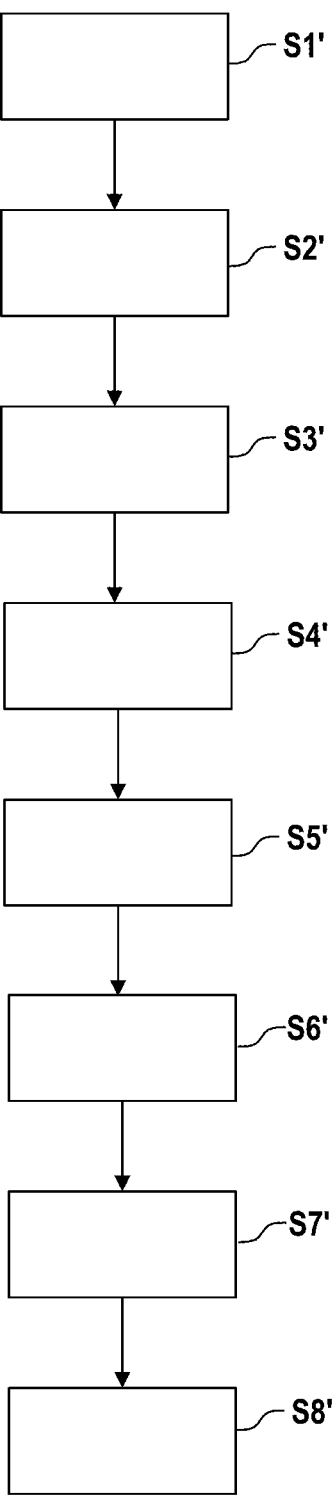
FIG. 12 shows a flowchart of a method for particle beam-induced processing of a defect of the photomask from FIGS. 1 and 9 to 11 in accordance with a second aspect.

In FIG. 7, the centers M, M' and M" of the pixels 304, 304' and 304" are depicted in overlaid fashion. Over the course of steps S4, S6 and S8, the electron beam 202 is directed repeatedly at each center (point of incidence) M, M', M". As is evident in FIG. 7, an edge region 310 of the defect D' can be scanned better by the second and third rasterization (centers M' and M") than is possible in the case where only the first rasterization (centers M) is applied.

In embodiments, steps S4, S6 and S8 are repeated over a number j of repetition cycles so that the overall number of repetition cycles for each of the n, m and 1 pixels 304, 304', 304" is e.g. (j×g) or (j×h).

To (completely) remove the coating 104 (FIG. 1) in the region of the defect D', a total number j (or j×g or j×h) of repetition cycles of 100, 1000, 10 000, 100 000 or one million, for example, can be applied at each pixel 304, 304', 304".

FIGS. 9 to 12 elucidate a method according to a second aspect for the particle beam-induced processing of a further example of a defect D" of a structured coating 104 of the photomask 100 from FIG. 1. By way of example, the method is carried out using the apparatus shown in FIG. 2. FIG. 9 shows a first embodiment of the method according to the second aspect.

As described above in conjunction with FIGS. 1 and 2, an image 300 of at least a portion of the photomask 100 (FIG. 1) is recorded in step S1' of the method according to the second aspect.

As described above in conjunction with FIGS. 1 and 2, a geometric shape of a defect E is determined in the image 300 as a repair shape 402 in step S2' of the method according to the second aspect. In step S2' of the method according to the second aspect, the geometric shape is determined in particular as a vectorial form that is based on a vectorial representation. FIG. 9 shows a further example of a defect E'.

A process gas is provided at least along a stretch 404 (FIG. 9) of the repair shape 402 in step S3' of the method according to the second aspect. Furthermore, an activating particle beam 202 (FIG. 2) is guided along the stretch 404 while simultaneously activating a chemical reaction between the process gas and a material of the photomask 100 (FIG. 1) on the stretch 404.

The stretch 404 according to the first embodiment (FIG. 9) of the method according to the second aspect extends linearly from an edge 406 of the repair shape 402 to an opposite edge 408 of the repair shape 402. In particular, the particle beam 202 is guided linearly along a first stretch 404 from a first starting point 410 at the first edge 406 to a first end point 412 at the second edge 408 without stopping. In particular, the first stretch 404 is the shortest path between the first starting point 410 and the first end point 412. A length of the first stretch 404 is provided with the reference sign 1. The chemical reaction between the process gas and the mask material is initiated on the entire stretch 404 for the purposes of repairing the defect D' during the continuous non-stop guidance of the particle beam 202 along the stretch 404.

Subsequently, the particle beam 202 at the second edge 408 is offset to a new second starting point 414 at the second edge 408 in a direction R perpendicular to the first stretch 404. Then, the particle beam 202 is guided along a second stretch 416 from the second starting point 414 to a second end point 418 at the first edge 406. By way of example, the second stretch 416 extends parallel to the first stretch 404.

In a corresponding manner, the entire repair shape can be swept by the particle beam 202 over a plurality of individual stretches 404, 416, 420, 422 (of which only four are shown and provided with a reference sign in FIG. 9). The activating particle beam 202 is guided with a speed greater than zero and without stopping (dwelling), in particular for each individual stretch 404, 416, 420, 422 along the entire individual stretch 404, 416, 420, 422.

FIG. 10 shows a second embodiment of the method according to the second aspect.

A first stretch 424 according to the second embodiment extends along an outer edge 426 and/or adjacent to the outer edge 426 of the repair shape 402'. In particular, the first stretch 424 extends from a first starting point 428 adjacent to the outer edge 426 along the entire outer edge 426 to a first end point 430 adjacent to the outer edge 426. In particular, the first end point 430 is arranged adjacent to the first starting point 428. Consequently, the particle beam 202 is guided along the first stretch 424 without stopping from the first starting point 428 to the first end point 430. The chemical reaction between the process gas and the mask material is initiated on the entire first stretch 424 during the guidance of the particle beam 202 along the first stretch 424.

Subsequently, the particle beam 202 is radially inwardly offset to a second starting point 432 from the outer edge 426 in the repair shape 402'. Then the particle beam 202 is guided from the second starting point 432 along a second stretch 434, which extends along a parallel curve parallel to the first stretch 424, to a second end point 436 on the parallel curve.

In a corresponding manner, the entire repair shape 402' can be swept by the particle beam 202 over a plurality of individual stretches 424, 434, 438 (of which only three are provided with a reference sign in FIG. 10) that extend along parallel curves parallel to the outer edge 426. What applies to each of the individual stretches 424, 434, 438 in particular is that the activating particle beam 202 is guided along the entire individual stretch 424, 434, 438 at a speed greater than zero and without stopping (dwelling).

As a result of this beam guiding pattern, it is possible to obtain a suitable particle beam dose of the electron beam 202, in particular also in an edge region or at the outer edge 426 of the defect E".

FIG. 11 shows a third embodiment of the method according to the second aspect.

According to the third embodiment, the repair shape 402' is subdivided into at least a first and a second sub-repair shape 440, 442. In the example shown, the first sub-repair shape 440 is an inner region of the repair shape 402'. Moreover, the second sub-repair shape 442 completely surrounds the inner first sub-repair shape 440.

Within the first sub-repair shape 440, a respective individual stretch 444 extends linearly from an edge 446 to an opposite edge 448 of the first sub-repair shape 440 (analogously to the case shown in FIG. 9). Moreover, a first individual stretch 450 within the second sub-repair shape 442 extends adjacently to an outer edge 452 of the second sub-repair shape 442. Moreover, further individual stretches 454, 456 extend within the second sub-repair shape 442 along parallel curves parallel to the outer edge 452 of the second sub-repair shape 442.

In embodiments, a speed with which the electron beam 202 (FIG. 2) is guided along the corresponding stretch (404, 416, 420, 422 in FIG. 9; 424, 434, 438 in FIG. 10; 444, 450, 454, 456 in FIG. 11) in the method according to the second aspect can be so high that the exposure time for an entire repair shape 402, 402' is of the order of the dwell time on a single pixel 304 (FIG. 3) in the method according to the first aspect. By way of example, a speed at which the electron beam 202 (FIG. 2) is guided along the corresponding stretch (FIGS. 9-11) is greater than or equal to 1 to 100 m/s. By way of example, the entire repair shape 402, 402' is completely swept over once in less than or equal to 50 to 200 ns. By way of example, a particle beam 202 used to this end is provided with a beam current of greater than or equal to 0.0001 to 0.01 µA. However, a beam current of the particle beam 202 may also adopt other values (e.g., smaller values of a few pA) in other examples. As a result of this quasi simultaneous exposure of the entire repair shape 402, 402', it is possible to obtain a particularly homogeneous particle beam dose over the entire repair shape 402, 402' and hence possible to obtain an even better and more accurate repair of the defect E', E'' (FIGS. 9-11) of the photomask 100 (FIG. 1).

In some implementations, the computing apparatus 226 (and/or the control device 228, the determination device 230) can include one or more data processors for processing data, one or more storage devices for storing data, such as one or more databases, and/or one or more computer programs including instructions that when executed by the computing apparatus 226 cause the computing apparatus 226 to carry out the processes. The computing apparatus 226 can include one or more input devices, such as a keyboard, a mouse, a touchpad, and/or a voice command input module, and one or more output devices, such as a display, and/or an audio speaker.

In some implementations, the computing apparatus 226 can include digital electronic circuitry, computer hardware, firmware, software, or any combination of the above. The features related to processing of data (e.g., one or more of the following:

determining (S2) a geometric shape of a defect (D, D') in the image (300) as a repair shape (302, 302'), subdividing (S3) the repair shape (302, 302') into a number of n pixels (304) in accordance with a first rasterization (306), subdividing (S5) the repair shape into a number of m pixels (304') in accordance with a second rasterization (306'), the second rasterization (306') emerging from a subpixel displacement of the first rasterization (306)) (e.g., one or more of the following: subdividing (S7) the repair shape (302') into a number of $l_i$ pixels (304'') in accordance with at least one further rasterization (306''), with an i-th further rasterization (306'') being subdivided into 1, pixels (304'') and the at least one further rasterization (306'') emerging from a subpixel displacement of the first (306), the second (306') or any other one of the at least one further rasterizations (306'')) (e.g., one or more of the following: subdividing the repair shape (402') into at least a first and a second sub-repair shape (440, 442), determining stretches (444) that extend linearly from one edge (446) of the first sub-repair shape (440) to an opposite edge (448) of the first sub-repair shape (440), and determining stretches (450, 454, 456) that extend along an outer edge (452) of the second sub-repair shape (442) and/or along a parallel curve (454, 456) parallel to the outer edge (452) of the second sub-repair shape (442)) can be implemented in a computer program product tangibly embodied in an information carrier, e.g., in a machine-readable storage device, for execution by a programmable processor; and the method steps related to processing of data can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computing apparatus 226 can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of the computing apparatus 226 can include one or more processors for executing instructions and one or more storage area devices for storing instructions and data. Generally, the computing apparatus 226 will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM, DVD-ROM, and/or Blu-ray discs.

In some implementations, the processes that involve processing of data can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, Blu-ray disc, solid state drive, or hard disk drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

Although the present invention has been described with reference to exemplary embodiments, it is modifiable in various ways.

LIST OF REFERENCE SIGNS

100 Photomask
102 Substrate
104 Coating
200 Apparatus
202 Particle beam
204 Vacuum housing
206 Vacuum pump
208 Sample stage
210 Electron column
212 Electron source
214 Electron or beam optics
216 Scanning unit
218 Detector
220 Gas provision unit
222 Valve
224 Gas line
226 Computing apparatus
228 Control device
230 Determination device
300 Image
302, 302' Repair shape
304, 304', 304" Pixel
306, 306', 306" Rasterization
308 Area of incidence
310 Edge region
402 Repair shape
404 Stretch
406 Edge
408 Edge
410 Starting point
412 End point
414 Starting point
416 Stretch
418 End point
420 Stretch
422 Stretch
424 Stretch
426 Edge
428 Starting point
430 End point
432 Starting point
434 Stretch
436 End point
438 Stretch
440 Sub-repair shape
442 Sub-repair shape
444 Stretch
446 Edge
448 Edge
450 Stretch
452 Edge
454 Stretch
456 Stretch
a Length
b Length
B Structure dimension
c Diameter
D, D' Defect
E, E', E" Defect
l Length
M, M', M" Center
R Direction
S1-S8 Method steps
S1'-S8' Method steps
X Direction
Y Direction

What is claimed is:

1. A method for particle beam-induced processing of a defect of a microlithographic photomask, including the steps of:

a1) providing an image of at least a portion of the photomask, b1) determining a geometric shape of a defect in the image as a repair shape, c1) subdividing the repair shape into a number of n pixels in accordance with a first rasterization, d1) subdividing the repair shape into a number of m pixels in accordance with a second rasterization, the second rasterization emerging from a subpixel displacement of the first rasterization, e1) providing an activating particle beam and a process gas at each of the n pixels of the repair shape in accordance with the first rasterization, and f1) providing the activating particle beam and the process gas at each of the m pixels of the repair shape in accordance with the second rasterization.

2. The method of claim 1, wherein the subpixel displacement is a displacement, more particularly a lateral displacement, of the first rasterization by a subpixel dimension.

3. The method of claim 1, wherein step e1) is repeated before step f1) with a number g of repetition cycles and/or step f1) is repeated with a number h of repetition cycles.

4. The method of claim 1, wherein steps e1) and f1) are repeated with a number j of repetition cycles.

5. The method of claim 1, wherein the method is applied for particle beam-induced etching of a defect of the microlithographic photomask and/or for particle beam-induced deposition of material on the microlithographic photomask in a region of the defect.

6. The method of claim 1, wherein the process gas includes an etching gas and/or a precursor gas.

7. The method of claim 1, wherein in step b1) a two-dimensional geometric shape of the defect in the image is determined as a repair shape.

8. The method of claim 1, wherein the repair shape is subdivided into the n pixels in such a way that the n pixels are arranged in columns and lines.

9. The method of claim 1, wherein the activating particle beam includes an electron beam and/or an ion beam.

10. The method of claim 1, wherein the activating particle beam remains in step e1) at each of the n pixels of the repair shape for a predetermined dwell time to initiate a chemical reaction between the process gas and a mask material at a location of the respective pixel.

11. The method of claim 1, wherein the activating particle beam remains in step f1) at each of the m pixels of the repair shape for a predetermined dwell time to initiate a chemical reaction between the process gas and a mask material at a location of the respective pixel.

12. The method of claim 1, including the steps of:

subdividing the repair shape into a number of li pixels in accordance with at least one further rasterization, with an i-th further rasterization being subdivided into li pixels and the at least one further rasterization emerging from a subpixel displacement of the first, the second or any other one of the at least one further rasterizations, and providing the activating particle beam and the process gas at each of the li pixels of the repair shape in accordance with the at least one further rasterization.

13. The method of claim 12, wherein the activating particle beam is in each case provided successively in a sequence at the n pixels, the m pixels and/or the li pixels of the repair shape, in which sequence a depletion of the process gas is implemented uniformly over the repair shape by a chemical reaction activated by the activating particle beam.

14. The method of claim 13, wherein the sequence in which the activating particle beam is successively provided at the n pixels, the m pixels and/or the li pixels of the repair shape has a random distribution.

15. An apparatus comprising:

a computing device comprising at least one storage device storing at least one computer program including instructions that when executed by the computing device cause the computing device to:

determine a geometric shape of a defect in an image of at least a portion of a microlithographic photomask as a repair shape, subdivide the repair shape into a number of n pixels in accordance with a first rasterization, subdivide the repair shape into a number of m pixels in accordance with a second rasterization, the second rasterization emerging from a subpixel displacement of the first rasterization, control an activating particle beam and a process gas to be provided at each of the n pixels of the repair shape in accordance with the first rasterization, and control the activating particle beam and the process gas to be provided at each of the m pixels of the repair shape in accordance with the second rasterization.

16. The apparatus of claim 15, wherein the subpixel displacement is a displacement, more particularly a lateral displacement, of the first rasterization by a subpixel dimension.

17. The apparatus of claim 15, wherein the computing device is configured to:

subdivide the repair shape into a number of li pixels in accordance with at least one further rasterization, with an i-th further rasterization being subdivided into li pixels and the at least one further rasterization emerging from a subpixel displacement of the first, the second or any other one of the at least one further rasterizations, and control the activating particle beam and the process gas to be provided at each of the li pixels of the repair shape in accordance with the at least one further rasterization.

18. The apparatus of claim 15, wherein the computing device is configured to repeat controlling an activating particle beam and a process gas to be provided at each of the n pixels of the repair shape in accordance with the first rasterization, before controlling the activating particle beam and the process gas to be provided at each of the m pixels of the repair shape in accordance with the second rasterization, with a number g of repetition cycles, and/or the computing device is configured to repeat controlling the activating particle beam and the process gas to be provided at each of the m pixels of the repair shape in accordance with the second rasterization with a number h of repetition cycles.

19. The apparatus of claim 15, wherein the computing device is configured to repeat controlling an activating particle beam and a process gas to be provided at each of the n pixels of the repair shape in accordance with the first rasterization, and controlling the activating particle beam and the process gas to be provided at each of the m pixels of the repair shape in accordance with the second rasterization, with a number j of repetition cycles.

20. The apparatus of claim 17, wherein the computing device is configured to in each case provide the activating particle beam successively in a sequence at the n pixels, the m pixels and/or the li pixels of the repair shape, in which sequence a depletion of the process gas is implemented uniformly over the repair shape by a chemical reaction activated by the activating particle beam.

* * * * *